United States Patent
Ayranci et al.

(10) Patent No.: US 9,774,303 B1
(45) Date of Patent: Sep. 26, 2017

(54) LOW-NOISE AMPLIFIER FOR INTRA-BAND NON CONTIGUOUS CARRIER AGREGATION

(71) Applicant: Marvell International Ltd., Hamilton HM (BM)

(72) Inventors: Emre Ayranci, Costa Mesa, CA (US); Marco Garampazzi, Casorate Primo (IT); Shahrzad Tadjpour, Laguna Niguel, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/246,977

(22) Filed: Aug. 25, 2016

Related U.S. Application Data

(60) Provisional application No. 62/209,681, filed on Aug. 25, 2015.

(51) Int. Cl.
  *H03F 1/56* (2006.01)
  *H03F 3/193* (2006.01)
  *H04B 1/10* (2006.01)

(52) U.S. Cl.
  CPC .............. *H03F 1/56* (2013.01); *H03F 3/193* (2013.01); *H03F 2200/222* (2013.01); *H03F 2200/294* (2013.01); *H03F 2200/451* (2013.01); *H04B 1/10* (2013.01)

(58) Field of Classification Search
  CPC .................... H03F 1/0288; H03F 1/07
  USPC ..................... 330/295, 124 R, 311
  See application file for complete search history.

(56) References Cited

U.S. PATENT DOCUMENTS

| | | | | |
|---|---|---|---|---|
| 8,903,343 B2* | 12/2014 | Holenstein | ............... | H04B 1/16 455/132 |
| 9,035,697 B2* | 5/2015 | Youssef | .................... | H03F 3/68 330/311 |
| 9,154,356 B2* | 10/2015 | Tasic | ......................... | H03G 3/20 |
| 9,603,187 B2* | 3/2017 | Tasic | ...................... | H03F 3/193 |
| 2013/0315348 A1* | 11/2013 | Tasic | ...................... | H03G 3/20 375/340 |
| 2017/0093343 A1* | 3/2017 | Xu | ............................ | H03F 1/26 |

* cited by examiner

*Primary Examiner* — Henry Choe

(57) ABSTRACT

A low noise amplifier (LNA) system for amplifying a plurality of carriers includes a first amplifier circuit that generates a first radio-frequency (RF) output signal by amplifying a first input RF signal corresponding to a first frequency band, the first amplifier circuit having a first input impedance, and a second amplifier circuit that generates a second RF output signal by amplifying the first input RF signal when the system is in a first multi-output mode, a second input impedance of the second amplifier having a first impedance value when the system is in the first multi-output mode. The LNA system further includes a first impedance controller that maintains the second input impedance of the second amplifier circuit at a second impedance value when the apparatus is in a mode other than the first multi-output mode. The second impedance value is substantially the same as the first impedance value.

20 Claims, 7 Drawing Sheets

100

610

S620
Amplifying a first RF input signal and outputting a first RF output signal in a multi-output mode by a first amplifier circuit

↓

S630
Amplifying a second RF input signal and outputting a second RF output signal in the multi-output mode by a second amplifier circuit

S660
Amplifying the first RF input signal and outputting the first RF output signal in a single-output mode by the first amplifier circuit

↓

S670
Maintaining, by an impedance controller, a first input impedance of the second amplifier circuit in the single-output mode substantially the same as a second input impedance of the second amplifier circuit in the multi-output mode

FIG. 6B

LOW-NOISE AMPLIFIER FOR INTRA-BAND NON CONTIGUOUS CARRIER AGREGATION

CROSS REFERENCE TO RELATED APPLICATION

This present disclosure claims the benefit of U.S. Provisional Application No. 62/209,681, filed on Aug. 25, 2015, which is incorporated by reference herein in its entirety.

BACKGROUND

Carrier Aggregation (CA) uses a plurality of component carriers, each operating at a different frequency or within a different frequency band, for communications between devices over a wireless interface. Carrier aggregation typically is used to increase a bandwidth of a communication interface between devices in a wireless network.

Intra-band contiguous CA uses a plurality of contiguous (with respect to frequency) component carriers within a band to communicate with a wireless device.

Intra-band non-contiguous (NC) CA uses a plurality of component carriers within a band to communicate with a wireless device, but does not require that the component carriers be contiguous. That is, in the NC CA, one or more non-aggregated carriers may exist that have frequencies between frequencies of two of the aggregated component carriers.

Inter-band NC CA uses a plurality of component carriers within a plurality of bands to communicate with a wireless device, and the component carriers may be non-contiguous and in different bands than each other.

When non-contiguous carriers are aggregated together for NC CA, a combined bandwidth of the aggregated carriers may be greater than a maximum bandwidth of a circuit (for example, a baseband circuit) in a receive chain of a wireless device.

SUMMARY

In an embodiment, a low noise amplifier (LNA) system for amplifying a plurality of carriers includes a first amplifier circuit that generates a first radio-frequency (RF) output signal by amplifying a first input RF signal corresponding to a first frequency band, the first amplifier circuit having a first input impedance, and a second amplifier circuit that generates a second RF output signal by amplifying the first input RF signal when the system is in a first multi-output mode, a second input impedance of the second amplifier having a first impedance value when the system is in the first multi-output mode. The LNA system further includes a first impedance controller that maintains the second input impedance of the second amplifier circuit at a second impedance value when the apparatus is in a mode other than the first multi-output mode. The second impedance value is substantially the same as the first impedance value.

In an embodiment, the first amplifier circuit includes a first gain transistor that receives the first input RF signal and a first cascode transistor that couples the first gain transistor to a first load circuit based on a first bias signal. The second amplifier circuit further includes a second gain transistor that receives the first input RF signal and a second cascode transistor that couples the second gain transistor to a second load circuit based on a second bias signal.

In an embodiment, the first impedance controller is coupled to a node between the second gain transistor and the second cascode transistor of the second amplifier circuit. The first impedance controller is configured to cause a first current to flow through the second gain transistor in the mode other than the first multi-output mode. The first current has a magnitude smaller than a second current flowing through the second gain transistor in the first multi-output mode.

In an embodiment, the first impedance controller includes a current source and an impedance control transistor connected to the current source in series. The impedance control transistor is connected to a node between the second gain transistor and the second cascode transistor.

In an embodiment, the current source is configured to cause a first current to flow through the impedance control transistor and the second gain transistor in the mode other than the first multi-output mode. The first current has a magnitude smaller than a second current flowing through the second gain transistor in the first multi-output mode.

In an embodiment, the magnitude of the first current is programmable.

In an embodiment, when the system is in the first multi-output mode, the first cascode transistor is turned on, the second cascode transistor is turned on, and the first impedance control transistor is turned off. The mode other than the first multi-output mode is a first single-output mode and, when the system is in the first single-output mode, the first cascode transistor is turned on, the second cascode transistor is turned off, and the first impedance control transistor is turned on to cause the first current to flow through the second gain transistor.

In an embodiment, the first load circuit includes a first inductor and a first variable capacitor and the first load circuit is configured to provide the first RF output signal. The second load circuit includes a second inductor and a second variable capacitor and the second load circuit is configured to provide the second RF output signal.

In an embodiment, the system further includes a third amplifier circuit that generates a third RF output signal by amplifying a second input RF signal corresponding to a second frequency band when the system is in a second multi-output mode, a third input impedance of the third amplifier circuit having a third impedance value when the apparatus is in the second multi-output mode, a fourth amplifier circuit that generates a fourth RF output signal by amplifying the second input RF signal, and a second impedance controller that maintains the third input impedance of the third amplifier circuit at a fourth impedance value when the system is in a second single-output mode, the fourth impedance value being substantially the same as the third impedance value.

In an embodiment, the third amplifier circuit further includes a third gain transistor that receives the second input RF signal and a third cascode transistor couples the third gain transistor to the first load circuit based on a third bias signal. The fourth amplifier circuit includes a fourth gain transistor that receives the second input RF signal and a fourth cascode transistor that couples the fourth gain transistor to a third load circuit based on a fourth bias signal.

In an embodiment, the first, second, third, and fourth amplifier circuits further include first, second, third, and fourth inductors, respectively. The first, second, third, and fourth inductors are connected to the first, second, third, and fourth gain transistors, respectively.

In an embodiment, the first load circuit includes a first inductor and a first variable capacitor, the first variable capacitor of the first load circuit having a first capacitance value in the first multi-output mode and a second capacitance value in the second multi-output mode.

In an embodiment, the system further includes a fifth amplifier circuit that generates a fifth RF output signal by amplifying a third input RF signal corresponding to a third band, a sixth amplifier circuit that generates a sixth RF output signal by amplifying a fourth input RF signal corresponding to a fourth band, and a seventh amplifier circuit that generates a seventh RF output signal by amplifying a fifth input RF signal corresponding to a fifth band.

In an embodiment, each of the fifth, sixth, and seventh amplifier circuits is connected to a third load circuit and an inductor.

In an embodiment, a method of controlling a low noise amplifier (LNA) system includes amplifying a first input radio-frequency (RF) signal corresponding to a first frequency band and generating a first RF output signal by a first amplifier circuit, the first amplifier circuit having a first input impedance, amplifying the first input RF signal and generating a second RF output signal when the system is in a first multi-output mode by a second amplifier circuit, a second input impedance of the second amplifier having a first impedance value when the system is in the first multi-output mode, and maintaining, by a first impedance controller, the second input impedance of the second amplifier circuit at a second impedance value when the system is in a mode other than the first multi-output mode, the second impedance value being substantially the same as the first impedance value.

In an embodiment, the first amplifier circuit includes a first gain transistor and a first cascode transistor and the second amplifier circuit includes a second gain transistor and a second cascode transistor. The method further includes coupling the first gain transistor to a first load circuit based on a first bias signal and coupling to the second gain transistor to a second load circuit based on a second bias signal.

In an embodiment, maintaining, by the first impedance controller, the second input impedance of the second amplifier circuit at the second impedance value when the system is in the mode other than the first multi-output mode includes causing a first current to flow through the second gain transistor, the first current having a magnitude smaller than a second current flowing through the second gain transistor in the first multi-output mode.

In an embodiment, the mode other than the first multi-output mode is a first single-output mode. The method further includes amplifying a second input RF signal corresponding to a second frequency band and generating a third RF output signal when the system is in a second multi-output mode by a third amplifier circuit, a third input impedance of the third amplifier circuit having a third impedance value when the system is in the second multi-output mode, amplifying the second input RF signal and generating a fourth RF output signal by a fourth amplifier circuit, and maintaining, by a second impedance controller, the third input impedance of the third amplifier circuit at a fourth impedance value when the system is in a second single-output mode, the fourth impedance value being substantially the same as the third impedance value.

In an embodiment, the first amplifier circuit includes a first gain transistor and a first cascode transistor and the second amplifier circuit includes a second gain transistor and a second cascode transistor. The third amplifier circuit includes a third gain transistor and a third cascode transistor and the fourth amplifier circuit includes a fourth gain transistor and a fourth cascode transistor. First, second, third, and fourth inductors are connected to the first, second, third, and fourth gain transistors, respectively. The method further includes configuring a first circuit including the first inductor and the first gain transistor, a second circuit including the second inductor and the second gain transistor, a third circuit including the third inductor and the third gain transistor, and a fourth circuit including the fourth inductor and the fourth gain transistor to have substantially the same inductance values.

In an embodiment, the method further includes amplifying a third input RF signal corresponding to a third frequency band and generating a fifth RF output signal by a fifth amplifier circuit, amplifying a fourth input RF signal corresponding to a fourth frequency band and generating a sixth RF output signal by a sixth amplifier circuit, and amplifying a fifth input RF signal corresponding to a fifth frequency band and generating a seventh RF output signal by a seventh amplifier circuit.

BRIEF DESCRIPTION OF THE DRAWINGS

FIGS. 6A and 6B are flowcharts illustrating processes of operating the first NC LNA of FIG. 2 in the multi-output mode and in the single-output mode, respectively, according to an embodiment.

DETAILED DESCRIPTION

A wireless device may support intra-band Non-Contiguous (NC) Carrier Aggregation (CA). Such a wireless device includes one or more of NC low-noise amplifiers (LNAs), each of which may operate in a single-output mode and in a multi-output mode. When an NC LNA operates in the single-output mode, the NC LNA receives a radio-frequency (RF) input signal and outputs a single RF output signal to a first receiver backend circuit. When the NC LNA operates in the multi-output mode, the NC LNA receives the RF input signal and outputs two RF output signals to the first and second receiver backend circuits, respectively. The NC LNA typically has different input impedance values in the single-output mode and the multi-output mode, and such a change in the input impedance values deteriorates the performance of the NC LNA, for example, by increasing signal reflection from the NC LNA.

Figure 1:
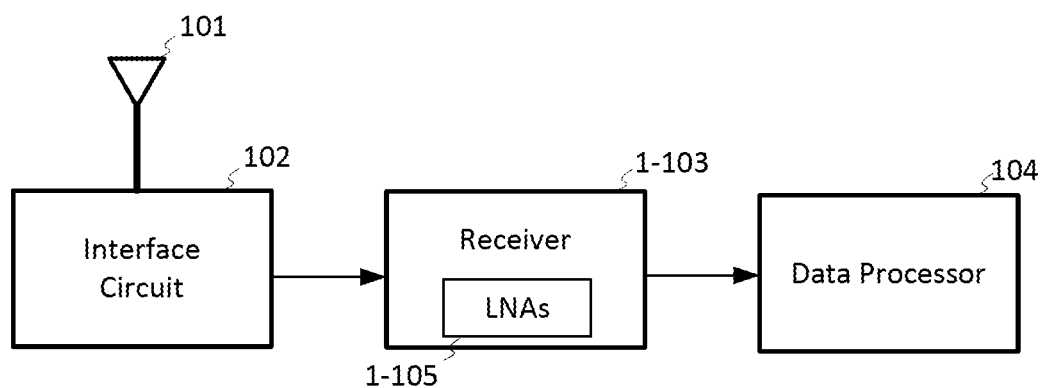
FIG. 1 is a block diagram of a wireless device according to an embodiment.

FIG. 1 is a block diagram of a wireless device 100 according to an embodiment. The wireless device 100 includes an antenna 101, an interface circuit 102, a receiver 1-103, and a data processor 104.

The antenna 101 receives an RF signal from base stations and/or other transmitter stations, in an embodiment, and provides the received RF signal to the interface circuit 102. The interface circuit 102 processes the provided RF signal and outputs the processed RF signal to the receiver 1-103. In an embodiment, the interface circuit 102 includes switches, duplexers, and filters.

The receiver 1-103 amplifies, downconverts, and filters the received RF signals, and provides the downconverted signals to the data processor 104. The receiver 1-103 includes one or more LNAs 1-105 having respective input impedance values in a single-output mode that are substantially the same as their respective input impedance values in a multi-output mode. The data processor 104 processes (e.g., demodulates and amplifies) the downconverted signals received through the receiver 1-103.

Figure 2:
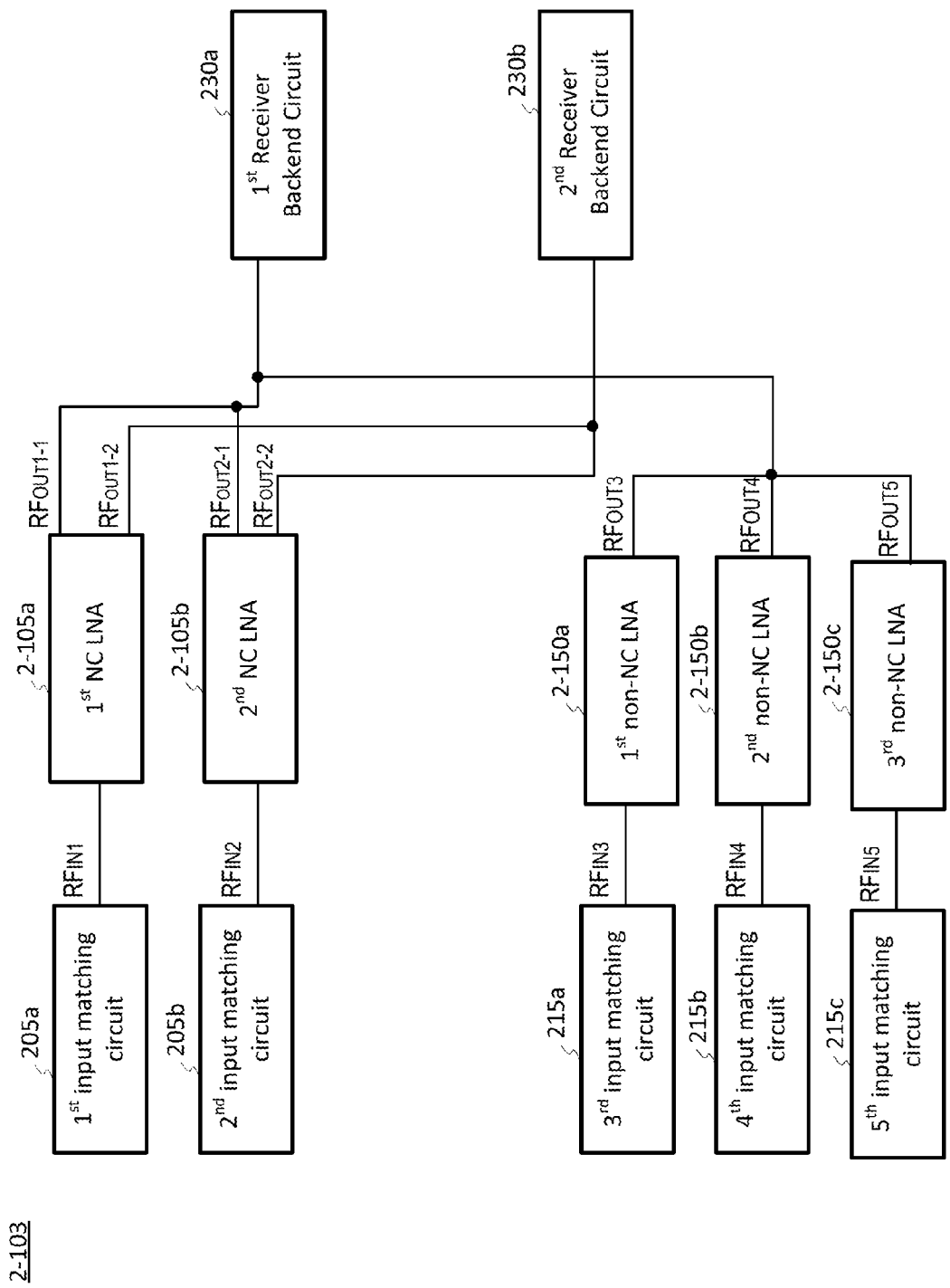
FIG. 2 is a block diagram of a portion of the receiver of FIG. 1 according to an embodiment.

FIG. 2 is a block diagram of a portion of a receiver 2-103 according to an embodiment. In an embodiment, the portion of the receiver 2-103 is suitable for use in the receiver 1-103 of FIG. 1.

The portion of the receiver 2-103 includes, in an embodiment, first, second, third, fourth, and fifth input matching circuits 205a, 205b, 215a, 215b, and 215c that respectively perform impedance matching, power matching, or both between a corresponding one of a first NC LNA 2-105a, a second NC LNA 2-105b, a first non-NC LNA 2-150a, a second non-NC LNA 2-150b, and a third non-NC LNA 2-150c and either an interface circuit (e.g., the interface circuit 120 of FIG. 1) or an antenna (e.g., the antenna 101 of FIG. 1) for a band of interest. Thus, the first, second, third, fourth, and fifth input matching circuits 205a, 205b, 215a, 215b, and 215c output first, second, third, fourth, and fifth RF input signals $RF_{IN1}$, $RF_{IN2}$, $RF_{IN3}$, $RF_{IN4}$, and $RF_{IN5}$ that are in different bands to the first NC LNA 2-105a, the second NC LNA 2-105b, the first non-NC LNA 2-150a, the second non-NC LNA 2-150b, and the third non-NC LNA 2-150c, respectively. In an embodiment, the first and second NC LNAs 2-105a and 2-105b are each an intra-band NC CA LNA that receives an RF input signal including a plurality of NC channels within the same frequency band. The intra-band NC CA LNA outputs a single RF output signal to a single receiver backend circuit when it operates in a single-output mode and outputs two RF output signals to two respective receiver backend circuits when it operates in a multi-output mode. The intra-band NC CA LNA maintains input impedance values in the single-output mode and the multi-output mode substantially the same, as will be described below in more detail with reference to FIGS. 3A and 3B.

The first NC LNA 2-105a, the second NC LNA 2-105b, the first non-NC LNA 2-150a, the second non-NC LNA 2-150b, and the third non-NC LNA 2-150c amplify the received first, second, third, fourth, and fifth RF input signals $RF_{IN1}$, $RF_{IN2}$, $RF_{IN3}$, $RF_{IN4}$, and $RF_{IN5}$, respectively.

The first NC LNA 2-105a, the second NC LNA 2-105b, the first non-NC LNA 2-150a, the second non-NC LNA 2-150b, or the third non-NC LNA 2-150c provides a corresponding one of first, third, fifth, sixth, and seventh RF output signals $RF_{OUT1-1}$, $RF_{OUT2-1}$, $RF_{OUT3}$, $RF_{OUT4}$, and $RF_{OUT5}$ to a first receiver backend circuit 230a. The first NC LNA 2-105a or the second NC LNA 2-105b provides a corresponding one of second and fourth RF output signals $RF_{OUT1-2}$ and $RF_{OUT2-2}$ to a second receiver backend circuit 230b.

When the first NC LNA 2-105a operates in a multi-output mode, the first NC LNA 2-105a receives the first RF input signal $RF_{IN1}$ from the first input matching circuit 205a, and outputs the first and second RF output signals $RF_{OUT1-1}$ and $RF_{OUT1-2}$ to the first and second receiver backend circuits 230a and 230b, respectively.

When the respective first and second NC LNA 2-105a and 2-105b each operate in a single-output mode, the first NC LNA 2-105a outputs the first RF output signal $RF_{OUT1-1}$ to the first receiver backend circuit 230a and the second NC LNA 2-105b outputs the fourth RF output signal $RF_{OUT2-2}$ to the second receiver backend circuit 230b.

When the second NC LNA 2-105b operates in a multi-output mode, the second NC LNA 2-105b receives the second RF input signal $RF_{IN2}$ from the second input matching circuit 205b, and outputs the third and fourth RF output signals $RF_{OUT2-1}$ and $RF_{OUT2-2}$ to the first and second receiver backend circuits 230a and 230b, respectively.

When the second NC LNA 2-105b operates in the single-output mode and one of the first, second, and third non-NC LNAs 2-150a, 2-150b, and 2-150c receives a corresponding RF input signal $RF_{IN3}$, $RF_{IN4}$, or $RF_{IN5}$, the second NC LNA 2-105b outputs the fourth RF output signal $RF_{OUT2-1}$ to the second receiver backend circuit 230b and the first, second, or third non-NC LNA 2-150a, 2-150b, or 2-150c outputs a corresponding RF output signal $RF_{IN3}$, $RF_{IN4}$, or $RF_{IN5}$ to the first receiver backend circuit 230a.

Although the receiver 2-103 includes two NC LNAs 2-105a and 2-105b and three non-NC LNAs 2-150a, 2-150b, and 2-150c, embodiments of the present disclosure are not limited thereto. It is noted that the receiver 2-103 may include, for instance, different numbers of NC LNAs and non-NC LNAs according to various modes of operation of the receiver 2-103.

In an embodiment, the first and second receiver backend circuits 230a and 230b processes a received signal in a band. In an embodiment, the first receiver backend circuit 230a, the second receiver backend circuit 230b, or both includes a mixer that processes the received signal. In an embodiment, the first receiver backend circuit 230a, the second receiver backend circuit 230b, or both extracts carriers in the band of the received signal, downconverts the extracted carriers, and provides the downconverted baseband signals to a data processor (e.g., the data processor 104 of FIG. 1).

Figure 3A:
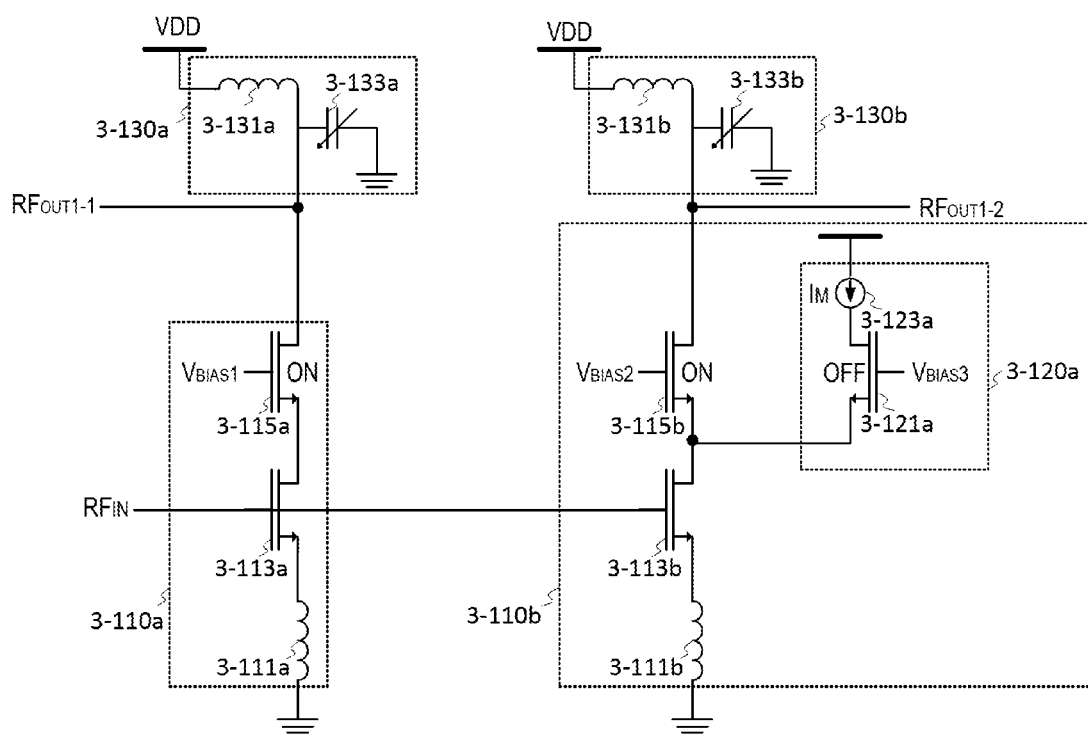
FIG. 3A is a circuit diagram of a non-contiguous (NC) LNA operating in a multi-output mode according to an embodiment.
Figure 3B:
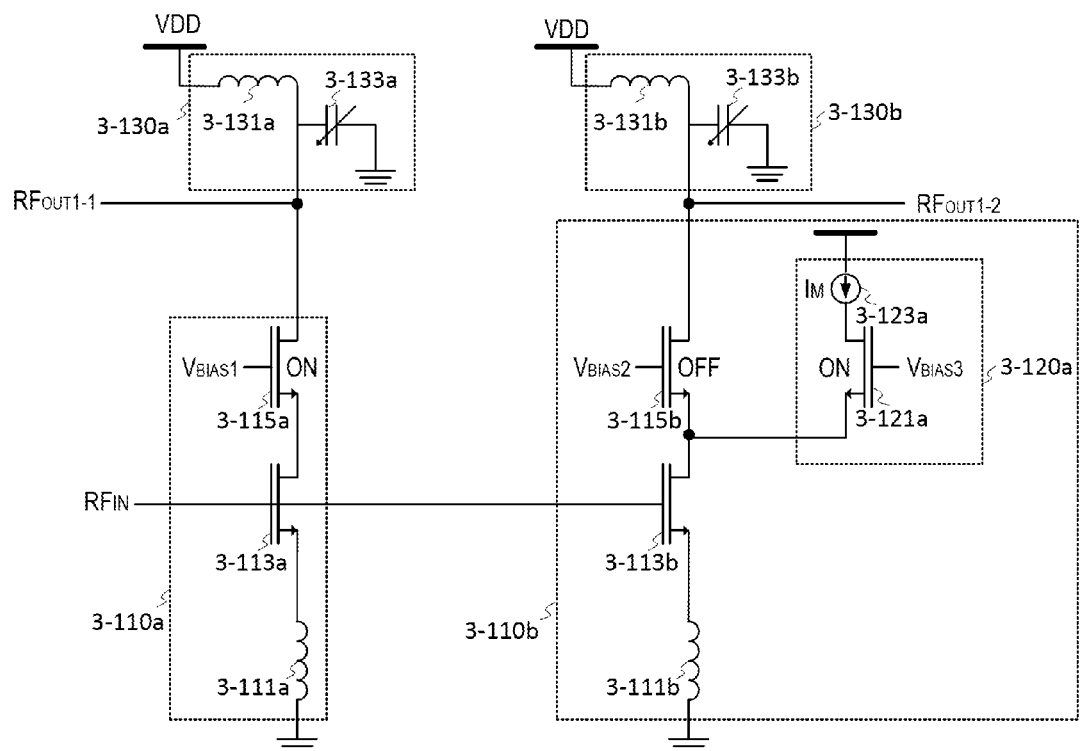
FIG. 3B is a circuit diagram of the NC LNA operating in a single-output mode according to an embodiment.

FIGS. 3A and 3B illustrate an NC LNA 3-105a. FIG. 3A illustrates the NC LNA 3-105a operating in a multi-output mode. FIG. 3B illustrates the NC LNA 3-105a operating in a single output-mode. In an embodiment, the LC LNA 3-105a operates in the multi-output mode or in the single-output mode in response to one or more control signals (e.g., a second bias signal $V_{BIAS2}$, a third bias signal $V_{BIAS3}$, or both). In an embodiment, the NC LNA 3-105a is suitable for use as the first NC LNA 2-105a of FIG. 2. The NC LNA 3-105a includes a first amplifier circuit 3-110a, a first load circuit 3-130a, a second load circuit 3-130b, and a second amplifier circuit 3-110b.

In an embodiment, the first amplifier circuit 3-110a together with the first load circuit 3-130a operates to amplify the input RF signal $RF_{IN}$ and provide the resulting amplified signal to the first output RF signal $RF_{OUT1-1}$ when the NC LNA 3-105a is operating in either of the single-output and the multi-output modes, and the second amplifier circuit 3-110b together with the second load circuit 3-130b operates to amplify the input RF signal $RF_{IN}$ and provide the resulting amplified signal to the second output RF signal $RF_{OUT1-2}$ only when the NC LNA 3-105a is operating in the multi-output mode.

The first amplifier circuit 3-110a includes a first cascode transistor 3-115a, a first gain transistor 3-113a, and a first source degeneration inductor 3-111a. The second amplifier circuit 3-110b includes a second cascode transistor 3-115b, a second gain transistor 3-113b, a second source degeneration inductor 3-111b, and an impedance controller 3-120a.

The impedance controller 3-120a includes a current source 3-123a and an impedance control transistor 3-121a, in an embodiment. In an embodiment, a magnitude of a current $I_M$ generated from the current source 3-123a is programmable. In an embodiment, the current source 3-123a includes a plurality of current sources (not shown) that are sequentially turned on until the magnitude of the current $I_M$ generated from the current source 3-123a reaches a predetermined target value.

Although FIG. 3A shows the impedance controller 3-120a that is connected to a node between the second cascode transistor 3-115b and the second gain transistor 3-113b of the second amplifier circuit 3-110b, embodiments of the present disclosure are not limited thereto. In another embodiment, the impedance controller 3-120a is connected to a node between the first cascode transistor 3-115a and the first gain transistor 3-113a of the first amplifier circuit 3-110a. In another embodiment, wherein the impedance controller 3-120a is connected to the node between the second cascode transistor 3-115b and the second gain transistor 3-113b of the second amplifier circuit 3-110b, an additional impedance controller (not shown) is connected to the node between the first cascode transistor 3-115a and the first gain transistor 3-113a of the first amplifier circuit 3-110a.

FIG. 3A shows the NC LNA 3-105a operating in the multi-output mode. In the multi-output mode, the first and second cascode transistors 3-115a and 3-115b are turned on, and the impedance control transistor 3-121a is turned off.

The first and second cascode transistors 3-115a and 3-115b are turned on by appropriately applying first and second bias signals $V_{bias1}$ and $V_{bias2}$ to gates of the first and second cascode transistors 3-115a and 3-115b, respectively. The impedance control transistor 3-121a is turned off by appropriately applying a third bias signal $V_{bias3}$ to a gate of the impedance control transistor 3-121a.

The first amplifier circuit 3-110a amplifies the input RF signal $RF_{IN}$ and provides a first amplified RF signal to the first load circuit 3-130a. The first load circuit 3-130a includes a first inductor 3-131a and a first variable capacitor 3-133a, and provides a first output RF signal $RF_{OUT1-1}$ that corresponds to a band frequency of the input RF signal $RF_{IN}$ to a first receiver backend circuit (e.g., the first receiver backend circuit 230a of FIG. 2). In an embodiment, the frequency of the band of the input RF signal $RF_{IN}$ is substantially the same as a resonant frequency of the first load circuit 3-130a, which is determined by a capacitance value of the first variable capacitor 3-133a and an inductance value of the first inductor 3-131a.

The second amplifier circuit 3-110b amplifies the input RF signal $RF_{IN}$ and provides a second amplified RF signal to the second load circuit 3-130b. The second load circuit 3-130b includes a second inductor 3-131b and a second variable capacitor 3-133b, and provides a second output RF signal $RF_{OUT2}$ that corresponds to the band frequency of the input RF signal $RF_{IN}$ to a second receiver backend circuit (e.g., the second receiver backend circuit 230b of FIG. 2). The band frequency is substantially the same as a resonant frequency of the second load circuit 3-130b, which is determined by a capacitance value of the second variable capacitor 3-133b and an inductance value of the second inductor 3-131b.

When the second amplifier circuit 3-110b operates in the multi-output mode, a first input impedance $Z_{in1}$ of the second amplifier circuit 3-110b that includes the second gain transistor 3-113b, the second cascode transistor 3-115b, and the second source degeneration inductor 3-111b with respect to the input RF signal $RF_{IN}$ is expressed as follows:

$$Z_{in1} = \frac{g_m L}{C_{gs}}. \qquad \text{Equation 1}$$

In Equation 1, $C_{gs}$ denotes a gate-source capacitance of the second gain transistor 3-113b, denotes a transconductance of the second gain transistor 3-113b, and L denotes an inductance value of the second source degeneration inductor 3-111b.

The transconductance $g_m$ of the second gain transistor 3-113b is proportional to a drain-source current flowing through the second gain transistor 3-113b. For example, when the second gain transistor 3-113b operates in a saturation mode, the transconductance $g_m$ of the second gain transistor 3-113b is expressed as follows:

$$g_m = \frac{\partial I_{ds1}}{\partial V_{gs}} = \sqrt{2k'_{n1} \frac{W_1}{L_1}} \sqrt{I_{ds1}}. \qquad \text{Equation 2}$$

In Equation 2, $k'_{n1}$ denotes a process transconductance parameter of the second gain transistor 3-113b, $W_1$ denotes a width of a channel in the second gain transistor 3-113b, $L_1$ denotes a length of the channel in the second gain transistor 3-113b, and $I_{ds1}$ denotes a drain-source current flowing through the second gain transistor 3-113b.

FIG. 3B illustrates an operation of the NC LNA 3-105a in the single-output mode. In the single-output mode, the first cascode transistor 3-115a and the impedance control transistor 3-121a are turned on, and the second cascode transistor 3-115b is turned off.

The first cascode transistor 3-115a and the impedance control transistor 3-121a are turned on by appropriately applying the first and third bias voltages $V_{bias1}$ and $V_{bias3}$ to the gates of the first cascode transistor 3-115a and the impedance control transistor 3-121a, respectively. The first amplifier circuit 3-110a and the first load circuit 3-130a operate similarly to the operation described with reference to FIG. 3A to provide the first output RF signal $RF_{OUT1}$ to the first receiver backend circuit.

The second cascode transistor 3-115b is turned off by appropriately applying the second bias signal $V_{bias2}$ to the gate of the second cascode transistor 3-115b. Because the second cascode transistor 3-115b is turned off, the second amplifier circuit 3-110b and the second load circuit 3-130b do not provide the second output RF signal $RF_{OUT2}$ to the second receiver backend circuit.

In an embodiment, a magnitude of the current $I_M$ that flows through the second gain transistor 3-113b in the single-output mode is smaller than a magnitude of the drain-source current $I_{ds1}$ that flows through the second gain transistor 3-113b in the multi-output mode, and thus the transconductance $g_m$ of the second gain transistor 3-113b in the single-output mode is smaller than that of the second gain transistor 3-113b in the multi-output mode. When the magnitude of the current $I_M$ is decreased, the gate-source capacitance $C_{gs}$ of the second gain transistor 3-113b is also reduced such that a ratio of the transconductance $g_m$ and the gate-source capacitance $C_{gs}$ of the second gain transistor 3-113b in the single-output mode remains substantially the same as the ratio in the multi-output mode. For example, a difference between the ratios in the single-output mode and the multi-output mode is equal to or less than 5%, 3%, or 1% of the ratio of the transconductance $g_m$ and the gate-source capacitance $C_{gs}$ of the second gain transistor 3-113b in the multi-output mode.

A second input impedance $Z_{in2}$ of the second amplifier circuit 3-110b with respect to the input RF signal $RF_{IN}$ in the single-output mode is proportional to the ratio of the transconductance $g_m$ and the gate-source capacitance $C_{gs}$ of the second gain transistor 3-113b in the single-output mode. As shown in Equation 1, the first input impedance $Z_{in1}$ of the second amplifier circuit 3-110b with respect to the input RF signal $RF_{IN}$ in the multi-output mode is proportional to the ratio of the transconductance $g_m$ and the gate-source capacitance $C_{gs}$ of the second gain transistor 3-113b in the multi-output mode. Thus, the second input impedance $Z_{in2}$ of the second amplifier circuit 3-110b in the single-output mode remains substantially the same as the first input impedance $Z_{in1}$ of the second amplifier circuit 3-110b in the multi-output mode.

As a result, a change in the input impedance of the NC LNA 3-105a that includes the first and second amplifier circuits 3-110a and 3-110b between the multi-output mode and the single output-mode may be reduced compared to a conventional NC LNA that does not include the impedance controller 3-120a. In addition, because the magnitude of the current $I_M$ of the current source 3-123a in the single-output mode can be smaller than that of the drain-source current that flows through the second cascode transistor 3-115b in the multi-output mode, power consumption of the NC LNA 3-105a can be reduced compared to when the magnitude of the current $I_M$ of the current source 3-123a is substantially equal to the drain-source current in the multi-output mode. In an embodiment, the magnitude of the current $I_m$ of the current source 3-123a is in a range of 3% to 97%, 5% to 95%, or 10 to 90% of the drain-source current that flows through the second cascode transistor 3-115b in the multi-output mode. In an embodiment, the magnitude of the current $I_m$ of the current source 3-123a is in a range from 1 mA to 2 mA.

Figure 4:
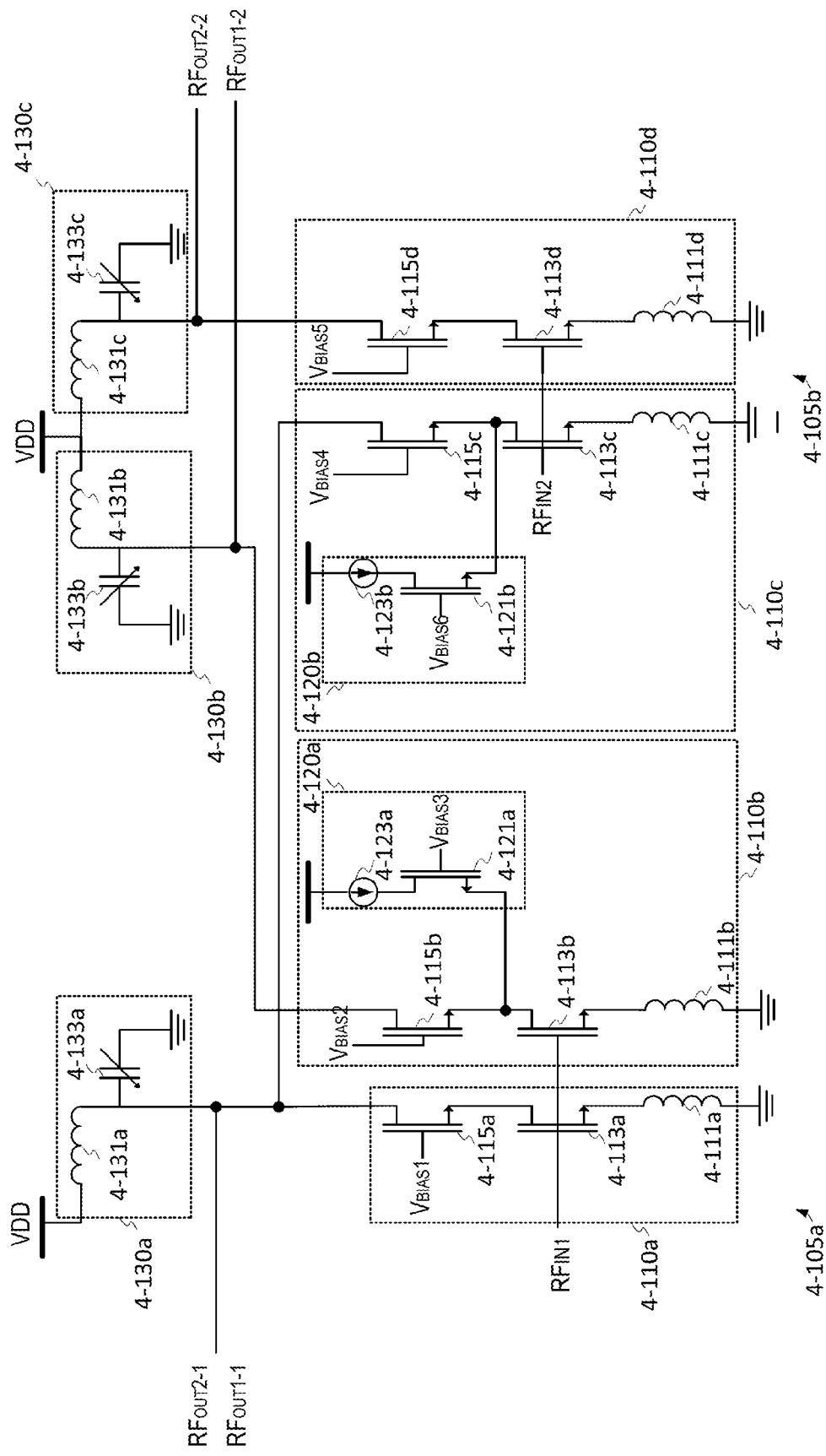
FIG. 4 is a circuit diagram of a circuit including first and second NC LNAs according to an embodiment.

FIG. 4 illustrates a circuit diagram of first and second NC LNAs 4-105a and 4-105b that are suitable for use as the first and second NC LNAs 2-105a and 2-105b of FIG. 2, respectively, according to an embodiment.

The first NC LNA 4-105a includes a first amplifier circuit 4-110a, a second amplifier circuit 4-110 that includes a first impedance controller 4-120a, a first load circuit 4-130a, and a second load circuit 4-130b. When the first NC LNA 4-105a operates in the multi-output mode, the first NC LNA 4-105a receives a first input RF signal $RF_{IN1}$ that is in a first band. Each of the first load circuit 4-130a and the second load circuit 4-130b has a first resonant frequency that is substantially the same as a frequency of the first band of the first input signal $RF_{IN1}$. As a result, the first NC LNA 4-105a provides first and second output RF signals $RF_{OUT1-1}$ and $RF_{OUT1-2}$ that are in the first band to the first and second receiver backend circuits, respectively, when operating in the multi-output mode.

The second NC LNA 4-105b includes a third amplifier circuit 4-110c that includes a second impedance controller 4-120b, a fourth amplifier circuit 4-110d, the first load circuit 4-130a, a third load circuit 4-130c. When the second NC LNA 4-105b operates in the multi-output mode, the second NC LNA 4-105b receives a second input RF signal $RF_{IN2}$ that is in a second band. Each of the first load circuit 4-130a and the third load circuit 4-130c has a second resonant frequency that is substantially the same as a frequency of the second band of the second input signal $RF_{IN2}$.

As a result, the second NC LNA 4-105b provides third and fourth output RF signals $RF_{OUT2-1}$ and $RF_{OUT2-2}$ that are in the second band to the first and second receiver backend circuits, respectively, when operating in the multi-output mode.

When both the first and second NC LNA 4-105a and 4-105b simultaneously operate, each of the first and second NC LNA 4-105a and 4-105b operates in the single-output mode. When the first NC LNA 4-105a operates in the single-output mode, the first NC LNA 4-105a receives the first input RF signal $RF_{IN1}$ that is in the first band. The first load circuit 4-130a has the first resonant frequency to provide the first output RF signal $RF_{OUT1-1}$ that is in the first band frequency to the first receiver backend circuit. A first impedance control transistor 4-121a is turned on to cause an input impedance value of the second amplifier circuit 4-110b in the single-output mode substantially equal to that of the second amplifier circuit 4-110b in the multi-output mode, as described with reference to FIGS. 3A and 3B.

Similarly, when the second NC LNA 4-105b operates in the single-output mode, the second NC LNA 4-105b receives the second input RF signal $RF_{IN2}$ that is in the second band. The third load circuit 4-130c has the second resonant frequency to provide the fourth output RF signal $RF_{OUT2-2}$ that is in the second band frequency to the second receiver backend circuit. A second impedance control transistor 4-121b is turned on to cause an input impedance value of the third amplifier circuit 4-110c in the single-output mode substantially equal to that of the third amplifier circuit 4-110c in the multi-output mode.

As described above, the first load circuit 4-130a has the first resonant frequency when the first NC LNA 4-105a operates in the multi-output mode, and the first load circuit 4-130a has the second resonant frequency when the second NC LNA 4-105b operates in the multi-output mode. In an embodiment, a capacitance value of a first variable capacitor 4-133a included in the first load circuit 4-130a is adjusted, such that the first load circuit 4-130a has the first resonant frequency or the second resonant frequency according to operation modes of the first and second NC LNAs 4-105a and 4-105b.

In an embodiment, the first and second input RF signals $RF_{IN1}$ and $RF_{IN2}$ that are in the first and second bands, respectively, include one or more carriers. In an embodiment, the first and second bands may cover one of 20, 25, 30, and 40 MHz, and the one or more carriers may cover one of 1.4, 3, 5, 10, 15 and 20 MHz.

Figure 5:
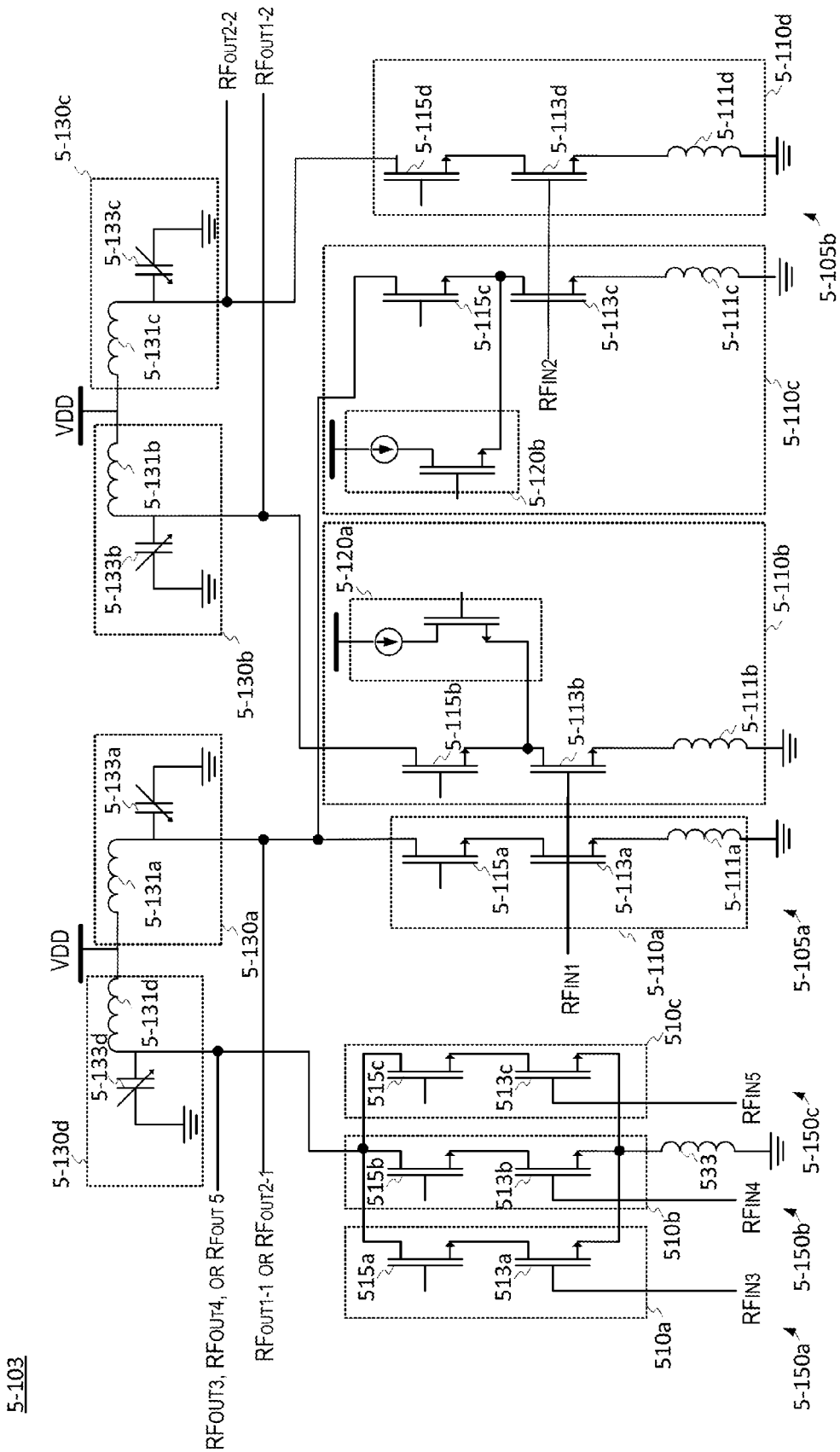
FIG. 5 is a circuit diagram of a circuit including NC LNAs and non-NC LNAs according to an embodiment.

FIG. 5 illustrates a circuit diagram a portion of a receiver 5-103, according to an embodiment. The circuit diagram includes first and second NC LNAs 5-105a and 5-105b that are suitable for use as the first and second NC LNAs 4-105a and 4-105b, respectively, of FIG. 4. The circuit diagram further includes first, second, and third non-NC LNAs 5-150a, 5-150b, and 5-150c that are suitable for use as the first, second, and third non-NC LNAs 2-150a, 2-150b, and 2-150c of FIG. 2, respectively.

The first NC LNA 5-105a includes first and second amplifier circuits 5-110a and 5-110b. The second amplifier circuit 5-110b includes a first impedance controller 5-120a. The first NC LNA 5-105a operates in a substantially similar fashion to the first NC LNA 4-105a of FIG. 4.

The second NC LNA 5-105b includes third and fourth amplifier circuits 5-110c and 5-110d. The third amplifier circuit 5-110c includes a second impedance controller 5-120b. The second NC LNA 5-105b operates in a substantially similar fashion to the second NC LNA 4-105b of FIG. 4.

The first, second, third, and fourth amplifier circuits 5-110a, 5-110b, 5-110c, and 5-110d include first, second, third, and fourth source degeneration inductors 5-111a, 5-111b, 5-111c, and 5-111d, respectively. Because the first, second, third, and fourth source degeneration inductors 5-111a, 5-111b, 5-111c, and 5-111d are connected to first, second, third, and fourth gain transistors 5-113a, 5-113b, 5-113c, and 5-113d, respectively, signal paths of the amplifier circuits 5-110a, 5-110b, 5-110c, and 5-110d are separate from each other. Thus, an interaction between the amplifier circuits 5-110a, 5-110b, 5-110c, and 5-110d is reduced to provide better noise isolation from each other compared to when two or more of the first, second, third, and fourth gain transistors 5-113a, 5-113b, 5-113c, and 5-113d are connected to a single inductor.

In an embodiment, routing lengths between two or more pairs of the first gain transistor 5-113a and the first source degeneration inductor 5-111a, the second gain transistor 5-113b and the second source degeneration inductor 5-111b, the third gain transistor 5-113c and the third source degeneration inductor 5-111c, and the fourth gain transistor 5-113d and the fourth source degeneration inductors 5-111d are different. In this embodiment, inductance values of the inductors 5-111a, 5-111b, 5-111c, and 5-111d are selected such that substantially the same inductance value is achieved for each pair of the first gain transistor 5-113a and the first source degeneration inductor 5-111a, the second gain transistor 5-113b and the second source degeneration inductor 5-111b, the third gain transistor 5-113c and the third source degeneration inductor 5-111c, and the fourth gain transistor 5-113d and the fourth source degeneration inductors 5-111d, regardless of the different routing lengths. For example, if an inductance value of a wiring between the first gain transistor 5-113a and the source degeneration inductor 5-111a is smaller than that of a wiring between the second gain transistor 5-113b and the second source degeneration inductor 5-111b, an inductance value of the first source degeneration inductor 5-111a is selected to be greater than that of the second source degeneration inductor 5-111b.

The first, second, and third non-NC LNAs 5-150a, 5-150b, and 5-150c include third, fourth, and fifth amplifier circuits 510a, 510b, and 510c. Each of the third, fourth, and fifth amplifier circuits 510a, 510b, and 510c respectively includes a corresponding gain transistor 513a, 513b, and 513c and a corresponding cascode transistor 515a, 515b, and 515c.

Sources of the gain transistors 513a, 513b, and 513c are each connected to a first terminal of a common inductor 533. Drains of the cascode transistors 515a, 515b, and 515c are each connected to a fourth load circuit 5-130d.

When the first non-NC LNA 5-105a receives a third input RF signal $RF_{IN3}$ that is in a third band, the fourth load circuit 5-130d has a third resonant frequency that is substantially the same as a frequency of the third band of the third input signal $RF_{IN3}$. As a result, the first non-NC LNA 5-105a provides a third output RF signal $RF_{OUT3}$ that is in the third band to the first receiver backend circuit.

When the second non-NC LNA 5-105b receives a fourth input RF signal $RF_{IN4}$ that is in a fourth band, the fourth load circuit 5-130d has a fourth resonant frequency that is substantially the same as a frequency of the fourth band of the fourth input signal $RF_{IN4}$. As a result, the second non-NC LNA 5-105b provides a fourth output RF signal $RF_{OUT4}$ that is in the fourth band to the first receiver backend circuit.

When the third non-NC LNA 5-105c receives a fifth input RF signal $RF_{IN5}$ that is in a fifth band, the fourth load circuit 5-130d has a fifth resonant frequency that is substantially the same as a frequency of the fifth band of the fifth input signal $RF_{IN5}$. As a result, the third non-NC LNA 5-105c provides a fifth output RF signal $RF_{OUT5}$ that is in the fifth band to the first receiver backend circuit.

As described above, the fourth load circuit 5-130d has one of the third, fourth, and fifth resonant frequencies that are in the third, fourth, and fifth bands, respectively. In an embodiment, a capacitance value of a fourth variable capacitor 5-133d included in the fourth load circuit 5-130d is adjusted, such that the fourth load circuit 4-130d has the first, fourth, or fifth resonant frequency when the first, second, or third non-NC LNA 5-150a, 5-150b, or 5-150c operates.

FIGS. 6A and 6B are flowcharts 600 and 650, which illustrate processes performed by a NC LNA that operates in a multi-output mode and a single-output mode, respectively, according to an embodiment. In an embodiment, the NC LNA corresponds to one of a first amplifier circuit and a second amplifier circuit that are suitable for use as the first amplifier circuit 3-110a and the second amplifier circuit 3-110b of FIGS. 3A and 3B, respectively.

Referring to FIG. 6A, at S620, the first amplifier circuit amplifies a first RF input signal and outputs a first RF output signal. In an embodiment, the first amplifier circuit includes a first gain transistor, a first cascode transistor, a first inductor, and the first cascode transistor is turned on to couple the first gain transistor to a first load circuit in the multi-output mode.

At S630, the second amplifier circuit amplifiers a second RF input signal and outputs a second RF output signal. In an embodiment, the second amplifier circuit includes a second gain transistor, a second cascode transistor, a second inductor, and an impedance controller, and the second cascode transistor is turned on to couple the second gain transistor to a second load circuit in the multi-output mode.

Referring to FIG. 6B, at S660, the first amplifier circuit amplifies the first RF signal and outputs the first RF output signal. In an embodiment, the first cascode transistor is turned on to couple the first gain transistor to the first load circuit in the single-output mode.

In the single-output mode, the second cascode transistor of the second amplifier circuit is turned off, and an impedance control transistor of the impedance controller is turned on. At S670, the impedance controller maintains an input impedance of the second amplifier circuit in the single-output mode substantially the same as an input impedance of the second amplifier circuit in the multi-output mode.

Aspects of the present disclosure have been described in conjunction with the specific embodiments thereof that are proposed as examples. Numerous alternatives, modifications, and variations to the embodiments as set forth herein are possible. Accordingly, embodiments as set forth herein are intended to be illustrative and not limiting.

What is claimed is:

1. A low noise amplifier (LNA) system for amplifying a plurality of carriers, the system comprising:
 a first amplifier circuit configured to generate a first radio-frequency (RF) output signal by amplifying a first input RF signal corresponding to a first frequency band, wherein the first amplifier circuit has a first input impedance;
 a second amplifier circuit configured to generate a second RF output signal by amplifying the first input RF signal when the system is in a first multi-output mode, wherein a second input impedance of the second amplifier has a first impedance value when the system is in the first multi-output mode; and a first impedance controller configured to maintain the second input impedance of the second amplifier circuit at a second impedance value when the apparatus is in a mode other than the first multi-output mode, the second impedance value being substantially the same as the first impedance value.

2. The system of claim 1, wherein the first amplifier circuit includes:
a first gain transistor configured to receive the first input RF signal; and
a first cascode transistor configured to couple the first gain transistor to a first load circuit based on a first bias signal, and
wherein the second amplifier circuit further includes:
a second gain transistor configured to receive the first input RF signal; and
a second cascode transistor configured to couple the second gain transistor to a second load circuit based on a second bias signal.

3. The system of claim 2, wherein the first impedance controller is coupled to a node between the second gain transistor and the second cascode transistor of the second amplifier circuit, and
wherein the first impedance controller is configured to cause a first current to flow through the second gain transistor in the mode other than the first multi-output mode, the first current having a magnitude smaller than a second current flowing through the second gain transistor in the first multi-output mode.

4. The system of claim 2, wherein the first impedance controller includes a current source and an impedance control transistor connected to the current source in series, the impedance control transistor being connected to a node between the second gain transistor and the second cascode transistor.

5. The system of claim 4, wherein the current source is configured to cause a first current to flow through the impedance control transistor and the second gain transistor in the mode other than the first multi-output mode, the first current having a magnitude smaller than a second current flowing through the second gain transistor in the first multi-output mode.

6. The system of claim 5, wherein the magnitude of the first current is programmable.

7. The system of claim 5, wherein, when the system is in the first multi-output mode, the first cascode transistor is turned on, the second cascode transistor is turned on, and the first impedance control transistor is turned off, and
wherein the mode other than the first multi-output mode is a first single-output mode and, when the system is in the first single-output mode, the first cascode transistor is turned on, the second cascode transistor is turned off, and the first impedance control transistor is turned on to cause the first current to flow through the second gain transistor.

8. The system of claim 2, wherein the first load circuit includes a first inductor and a first variable capacitor and the first load circuit is configured to provide the first RF output signal, and
wherein the second load circuit includes a second inductor and a second variable capacitor and the second load circuit is configured to provide the second RF output signal.

9. The system of claim 2, further comprising:
a third amplifier circuit configured to generate a third RF output signal by amplifying a second input RF signal corresponding to a second frequency band when the system is in a second multi-output mode, a third input impedance of the third amplifier circuit having a third impedance value when the apparatus is in the second multi-output mode;
a fourth amplifier circuit configured to generate a fourth RF output signal by amplifying the second input RF signal; and
a second impedance controller configured to maintain the third input impedance of the third amplifier circuit at a fourth impedance value when the system is in a second single-output mode, the fourth impedance value being substantially the same as the third impedance value.

10. The system of claim 9, wherein the third amplifier circuit further includes:
a third gain transistor configured to receive the second input RF signal; and
a third cascode transistor configured to couple the third gain transistor to the first load circuit based on a third bias signal, and
wherein the fourth amplifier circuit includes:
a fourth gain transistor configured to receive the second input RF signal; and
a fourth cascode transistor configured to couple the fourth gain transistor to a third load circuit based on a fourth bias signal.

11. The system of claim 10, wherein the first, second, third, and fourth amplifier circuits further include first, second, third, and fourth inductors, respectively, and
wherein the first, second, third, and fourth inductors are connected to the first, second, third, and fourth gain transistors, respectively.

12. The system of claim 10, wherein the first load circuit includes a first inductor and a first variable capacitor, the first variable capacitor of the first load circuit having a first capacitance value in the first multi-output mode and a second capacitance value in the second multi-output mode.

13. The system of claim 9, further comprising:
a fifth amplifier circuit configured to generate a fifth RF output signal by amplifying a third input RF signal corresponding to a third band;
a sixth amplifier circuit configured to generate a sixth RF output signal by amplifying a fourth input RF signal corresponding to a fourth band; and
a seventh amplifier circuit configured to generate a seventh RF output signal by amplifying a fifth input RF signal corresponding to a fifth band.

14. The system of claim 13, wherein each of the fifth, sixth, and seventh amplifier circuits is connected to a third load circuit and an inductor.

15. A method of controlling a low noise amplifier (LNA) system comprising:
amplifying a first input radio-frequency (RF) signal corresponding to a first frequency band and generating a first RF output signal by a first amplifier circuit, wherein the first amplifier circuit has a first input impedance;
amplifying the first input RF signal and generating a second RF output signal when the system is in in a first multi-output mode by a second amplifier circuit, wherein a second input impedance of the second amplifier has a first impedance value when the system is in the first multi-output mode; and
maintaining, by a first impedance controller, the second input impedance of the second amplifier circuit at a second impedance value when the system is in a mode other than the first multi-output mode, the second impedance value being substantially the same as the first impedance value.

16. The method of claim 15, wherein the first amplifier circuit includes a first gain transistor and a first cascode transistor and wherein the second amplifier circuit includes a second gain transistor and a second cascode transistor, the method further comprising:
coupling the first gain transistor to a first load circuit based on a first bias signal; and
coupling to the second gain transistor to a second load circuit based on a second bias signal.

17. The method of claim 16, wherein maintaining, by the first impedance controller, the second input impedance of the second amplifier circuit at the second impedance value when the system is in the mode other than the first multi-output mode comprises causing a first current to flow through the second gain transistor, the first current having a magnitude smaller than a second current flowing through the second gain transistor in the first multi-output mode.

18. The method of claim 15, wherein the mode other than the first multi-output mode is a first single-output mode, the method further comprising:
amplifying a second input RF signal corresponding to a second frequency band and generating a third RF output signal when the system is in a second multi-output mode by a third amplifier circuit, a third input impedance of the third amplifier circuit having a third impedance value when the system is in the second multi-output mode;
amplifying the second input RF signal and generating a fourth RF output signal by a fourth amplifier circuit; and
maintaining, by a second impedance controller, the third input impedance of the third amplifier circuit at a fourth impedance value when the system is in a second single-output mode, the fourth impedance value being substantially the same as the third impedance value.

19. The method of claim 18, wherein the first amplifier circuit includes a first gain transistor and a first cascode transistor, and the second amplifier circuit includes a second gain transistor and a second cascode transistor,
wherein the third amplifier circuit includes a third gain transistor and a third cascode transistor, and the fourth amplifier circuit includes a fourth gain transistor and a fourth cascode transistor, and
wherein first, second, third, and fourth inductors are connected to the first, second, third, and fourth gain transistors, respectively, the method further comprising:
configuring a first circuit including the first inductor and the first gain transistor, a second circuit including the second inductor and the second gain transistor, a third circuit including the third inductor and the third gain transistor, and a fourth circuit including the fourth inductor and the fourth gain transistor to have substantially the same inductance values.

20. The method of claim 18, further comprising:
amplifying a third input RF signal corresponding to a third frequency band and generating a fifth RF output signal by a fifth amplifier circuit;
amplifying a fourth input RF signal corresponding to a fourth frequency band and generating a sixth RF output signal by a sixth amplifier circuit; and
amplifying a fifth input RF signal corresponding to a fifth frequency band and generating a seventh RF output signal by a seventh amplifier circuit.

* * * * *